(12) United States Patent
Suzuki et al.

(10) Patent No.: US 10,211,375 B2
(45) Date of Patent: Feb. 19, 2019

(54) LIGHT EMITTING DEVICE

(71) Applicant: NICHIA CORPORATION, Anan-shi, Tokushima (JP)

(72) Inventors: Shigeyuki Suzuki, Anan (JP); Hiroyuki Watanabe, Itano-gun (JP); Shoji Hosokawa, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 15/795,444

(22) Filed: Oct. 27, 2017

(65) Prior Publication Data

US 2018/0123000 A1 May 3, 2018

(51) Int. Cl.
*H01L 33/00* (2010.01)
*H01L 33/50* (2010.01)
(Continued)

(52) U.S. Cl.
CPC ........ *H01L 33/502* (2013.01); *C09K 11/7734* (2013.01); *C09K 11/7774* (2013.01); *H01L 33/486* (2013.01); *H01L 33/56* (2013.01); *H05B 33/14* (2013.01); *H01L 2224/32245* (2013.01); *H01L 2224/48091* (2013.01); *H01L 2224/48247* (2013.01); *H01L 2224/48257* (2013.01); *H01L 2224/73265* (2013.01)

(58) Field of Classification Search
USPC .......... 257/116, 117, 432–437, 749, 257/E33.056–E33.059, E25.032, 257/E27.133–E27.139, 79–103, 918, 257/E51.018–E51.022, E33.001–E33.077, 257/E33.054, E25.028; 438/83, 9, 100, 438/101, 111, 112, 123, 124, 411, 412, 438/461, 584, 597–688, 22–47, 69, 493, 438/503, 507, 956
See application file for complete search history.

(56) References Cited

U.S. PATENT DOCUMENTS 7,253,446 B2* 8/2007 Sakuma ................ C04B 35/597
257/78
7,825,578 B2* 11/2010 Takashima .............. H01L 33/44
257/98
(Continued)

FOREIGN PATENT DOCUMENTS

JP 2006063286 A 3/2006
JP 2007-013053 A 1/2007
(Continued)

*Primary Examiner* — Tram H Nguyen
(74) *Attorney, Agent, or Firm* — Hunton Andrews Kurth LLP

(57) ABSTRACT

Provided is a light emitting device which includes a light emitting element having a peak emission wavelength in a range of 400 nm to 500 nm, and a fluorescent member containing a fluorescent material having a peak emission wavelength in a range of 630 nm to 670 nm, and a composition represented by the formula. $Ca_sSr_tEu_uSi_vAl_wN_x$. In the formula, s, t, u, v, w, and x satisfy $0.25 \leq s \leq 0.5$, $0.4 \leq t \leq 0.75$, $0.01 \leq u \leq 0.04$, $0.8 \leq s+t+u \leq 1.1$, $0.8 \leq v \leq 1.2$, $0.8 \leq w \leq 1.2$, $1.8 \leq v+w \leq 2.2$, and $2.5 \leq x \leq 3.2$. The light emitting device emits light having an x value of CIE 1931 chromaticity coordinates of 0.640 or more.

16 Claims, 6 Drawing Sheets

(51) Int. Cl.
  *C09K 11/77*    (2006.01)
  *H01L 33/48*    (2010.01)
  *H01L 33/56*    (2010.01)
  *H05B 33/14*    (2006.01)

(56) References Cited

U.S. PATENT DOCUMENTS

| | | |
|---|---|---|
| 2007/0001568 A1 | 1/2007 | Kaneko et al. |
| 2012/0080704 A1 | 4/2012 | Juang et al. |
| 2013/0292717 A1 | 11/2013 | Seibel, II |
| 2015/0214444 A1* | 7/2015 | Watanabe ............. H01L 33/502 |
| | | 257/98 |
| 2015/0308657 A1 | 10/2015 | Liu et al. |
| 2015/0327446 A1 | 11/2015 | Kawaguchi et al. |
| 2016/0126428 A1 | 5/2016 | Hosokawa et al. |

FOREIGN PATENT DOCUMENTS

| | | |
|---|---|---|
| JP | 2012077300 A | 4/2012 |
| JP | 2015-142056 A | 8/2015 |
| JP | 2015-163689 A | 9/2015 |
| JP | 2016-092401 A | 5/2016 |
| WO | 2014125714 A1 | 8/2014 |

* cited by examiner

LIGHT EMITTING DEVICE

CROSS-REFERENCE TO RELATED APPLICATIONS

This application claims priority to Japanese Patent Application No. 2016-212988, filed on Oct. 31, 2016, and Japanese Patent Application No. 2017-203604, filed on Oct. 20, 2017, the disclosures of which are hereby incorporated by reference in their entirety.

BACKGROUND

Technical Field

This disclosure relates to a light emitting device.

Description of the Related Art

Light emitting diodes (LEDs) are recently widely used as a highly energy-saving light emitting element. For example, an LED that emits red monochromatic light is used for stop lamps in the field of in-vehicle equipment. On the other hand, in place of an LED that emits monochromatic light, for example, International Patent Application Publication No. WO 2014/125714 describes a light emitting device including a light emitting element that emits ultraviolet light to blue light, and a fluorescent material that absorbs light from the light emitting element and performs wavelength conversion to emit red light.

SUMMARY

A light emitting device includes a light emitting element having a peak emission wavelength in a range of 400 nm to 500 nm, and a fluorescent member containing a fluorescent material having a peak emission wavelength in a range of 630 nm to 670 nm, and a composition represented by formula (I) below. The light emitting device emits light having an x value of CIE 1931 chromaticity coordinates of 0.640 or more.

$$Ca_sSr_tEu_uSi_vAl_wN_x \quad (I)$$

In formula (I), s, t, u, v, w, and x satisfy $0.25 \leq s \leq 0.5$, $0.4 \leq t \leq 0.75$, $0.01 \leq u \leq 0.04$, $0.8 \leq s+t+u \leq 1.1$, $0.8 \leq v \leq 1.2$, $0.8 \leq w \leq 1.2$, $1.8 \leq v+w \leq 2.2$, and $2.5 \leq x \leq 3.2$.

DETAILED DESCRIPTION

Figure 1:
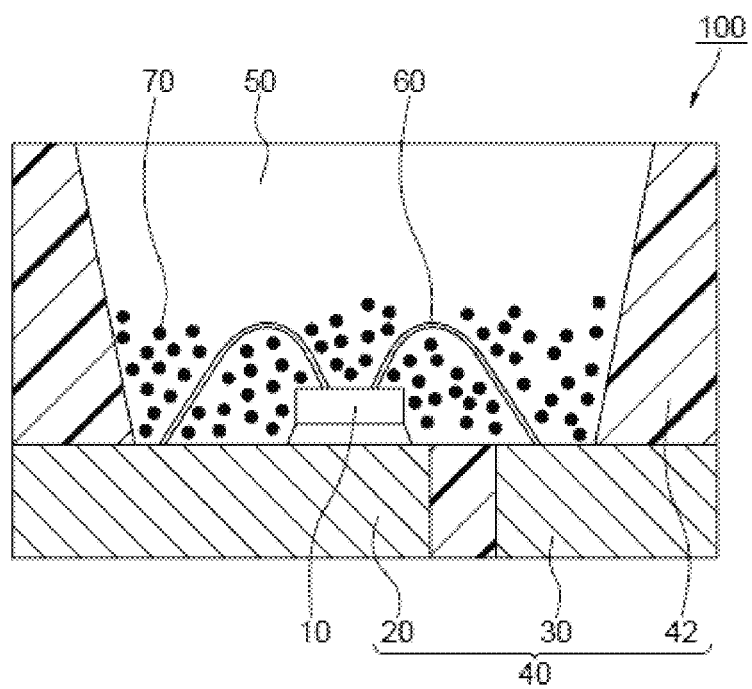
FIG. 1 is a schematic cross-sectional view of an exemplary light emitting device according to an embodiment of the present disclosure.

There is a need for a red light-emitting light emitting device that includes a light emitting element and a fluorescent material that has a further improved luminous flux.

Embodiments of the present disclosure provide a light emitting device that emits red light with high luminous flux.

A first aspect of the present disclosure is a light emitting device which includes a light emitting element having a peak emission wavelength in a range of 400 nm to 500 nm, and a fluorescent member containing a fluorescent material having a peak emission wavelength in a range of 630 nm to 670 nm, and a composition represented by formula (I) below. The light emitting device emits light having an x value of CIE 1931 chromaticity coordinates of 0.640 or more.

$$Ca_sSr_tEu_uSi_vAl_wN_x \quad (I)$$

In formula (I), s, t, u, v, w, and x satisfy $0.25 \leq s \leq 0.5$, $0.4 \leq t \leq 0.75$, $0.01 \leq u \leq 0.04$, $0.8 \leq s+t+u \leq 1.1$, $0.8 \leq v \leq 1.2$, $0.8 \leq w \leq 1.2$, $1.8 \leq v+w \leq 2.2$, and $2.5 \leq x \leq 3.2$.

A second aspect of the present disclosure is a light emitting device which includes a light emitting element having a peak emission wavelength in a range of 400 nm to 500 nm, and a fluorescent member containing a fluorescent material having a peak emission wavelength in a range of 630 nm to 670 nm, and a composition represented by formula (I) above. The light emitting device emits light with CIE 1931 chromaticity coordinates (x, y) within the chromaticity range defined by an area determined by connecting points (0.500, 0.280), (0.540, 0.340), (0.625, 0.375), (0.735, 0.262), and (0.600, 0.200) with straight lines.

A light emitting device according to the present disclosure will now be described with reference to embodiments. However, the embodiments shown below are mere exemplary light emitting devices for embodying the technical concept of the present invention, and the present invention is not limited to the embodiments below. The relationship between the color names and the chromaticity coordinates, the relationship between the wavelength ranges of light and the color names of monochromatic light, and others are in accordance with Japanese Industrial Standard (JIS) Z8110. For the amount of each component contained in a composition, when a plurality of substances corresponding to the component is present in the composition, the amount of the component means the total amount of the substances present in the composition unless otherwise specified.

Light Emitting Device

The light emitting device according to an embodiment of the present disclosure includes a light emitting element having a peak emission wavelength in a range of 400 nm to 500 nm, and a fluorescent member containing a fluorescent material having a peak emission wavelength in a range of 630 nm to 670 nm, and a composition represented by formula (I) above. The light emitting device emits light having an x value of CIE 1931 chromaticity coordinates of 0.640 or more.

The light emitting device includes a fluorescent member containing a fluorescent material with a specific composition having a peak emission wavelength in a specific wavelength range to allow the emission color of the light emitting device to have a particular chromaticity coordinate x. Thus, the light emitting device can emit red light with high luminous flux. Also, the light emitting device can emit red light with high color purity.

The light emitting device can emit red light with high luminous flux. The light emitting device can emit light with an x value of CIE 1931 chromaticity coordinates of 0.640 or more, 0.660 or more, or 0.670 or more. The upper limit of x is, for example, 0.720 or less. The chromaticity coordinate y is, for example, from 0.300 to 0.340, or from 0.310 to 0.330.

The light emitting device may emit light with chromaticity coordinates (x, y) within the chromaticity range defined by connecting a first point (0.500, 0.280), a second point (0.540, 0.340), a third point (0.625, 0.375), a fourth point (0.735, 0.262), and a fifth point (0.600, 0.200) with straight lines in this order, and further connecting the fifth point with the first point with a straight line in the CIE 1931 chromaticity diagram. The light emitting device includes a fluorescent member containing a fluorescent material with a specific composition having a peak emission wavelength in a specific wavelength range to allow the emission color of the light emitting device to have particular chromaticity coordinates. Thus, the light emitting device can emit red light with high luminous flux. In the light emitting device, the fifth chromaticity coordinates may be (0.650, 0.220).

The light emitting device according to the present embodiment of the present disclosure shows a spectrum for emission intensity relative to wavelength with at least a substantially single peak (hereinafter also referred to as "main peak emission"), and a peak emission wavelength of the maximum emission intensity (peak emission intensity of the light emitting device) in a range of 630 nm to 670 nm, 640 nm to 660 nm, or 645 nm to 655 nm. The main peak emission has a half bandwidth of, for example, 100 nm or less, or 95 nm or less, and, for example, 75 nm or more, or 80 nm or more. The main peak emission mainly derives from emission from the fluorescent material, and contains no emission peak from the light emitting element itself.

The light emitting device may have an emission spectrum where the emission intensity ratio at the peak emission wavelength of the light emitting element relative to the maximum emission intensity (the peak emission intensity of the light emitting device) is, for example, 2% or less, 1.9% or less, or 1.8% or less, and is, for example, 0.2% or more, 0.25% or more, or 0.3% or more. With the intensity ratio equal to or less than the upper limit, the color purity tends to be improved, whereas with the intensity ratio equal to or greater than the lower limit, the emission efficiency tends to be improved to achieve high luminous flux.

The light emitting device 100 according to an embodiment of the present disclosure will now be described with reference to FIG. 1. The light emitting device 100 is a surface-mount light emitting device. The light emitting device 100 includes a light emitting element 10, and a molded body 40, on which the light emitting element 10 is disposed. The light emitting element 10 is a gallium nitride compound-semiconductor that emits visible light at short-wavelengths (e.g., in a range of 380 nm to 500 nm) and has a peak emission wavelength in a range of 400 nm to 500 nm. The molded body 40 includes a first lead 20 and a second lead 30, and a resin portion 42 formed in an integral manner. The molded body 40 has a recess defined by a bottom surface and side surfaces, and the light emitting element 10 is disposed on the bottom surface of the recess. The light emitting element 10 has a pair of electrodes, positive and negative, and the positive and negative electrodes are electrically connected to the first lead 20 and the second lead 30, respectively, with a wire 60. The light emitting element 10 is covered with a fluorescent member 50. The fluorescent member 50 includes, for example, a fluorescent material 70, which converts the wavelength of light from the light emitting element 10, and a resin.

In FIG. 1, particles of the fluorescent material 70 are unevenly dispersed closer to the light emitting element 10 in the fluorescent member 50. In other words, in FIG. 1, the fluorescent member 50 includes a first layer (also referred to as a sedimentary layer) containing the fluorescent material 70 and arranged closer to the light emitting element 10, and a second layer formed on the first layer and containing essentially no fluorescent material 70 (also referred to as a resin layer). Arranging the fluorescent material 70 closer to the light emitting element 10 in this manner allows the wavelength of light from the light emitting element 10 to be efficiently converted to produce a light emitting device with high emission efficiency. However, the arrangement of the fluorescent material 70 and the light emitting element 10 in the fluorescent member 50 is not limited to one in which they are in close proximity to each other. The fluorescent material 70 may be arranged spaced apart from the light emitting element 10 in the fluorescent member 50 to reduce the influence of heat from the light emitting element 10 on the fluorescent material 70. The particles of the fluorescent material 70 may also be approximately evenly dispersed throughout the fluorescent member 50 to obtain light with further reduced color unevenness.

The light emitting device 100 with the first layer containing particles of the fluorescent material 70 and arranged immediately above the light emitting element can have a smaller thickness compared with the case where the fluorescent member 50 contains a fluorescent material having a composition different from the composition represented by formula (I). Thus, the luminous flux of the light emitting device 100 tends to be even greater. The thickness of the first layer is, for example, 180 μm or less, preferably 170 μm or less, more preferably 150 μm or less, and still more preferably 140 μm or less, and the lower limit is, for example, 30 μm or more. Further, the ratio of the thickness of the first layer relative to the thickness of the fluorescent member immediately above the light emitting element (thickness of the first layer/thickness of the fluorescent member) is, for example, 75% or less, preferably 70% or less, and more preferably 60% or less, and the lower limit is, for example, 30% or more. For the determination of the thicknesses of the first layer and the second layer immediately above the light emitting element 10, the presence or absence of the fluorescent material is observed in a cross section of the light emitting device, and the thickness of the portion where the fluorescent material is observed is referred to as the thickness of the first layer, and the thickness of the portion where the fluorescent material is not observed is referred to as the thickness of the second layer. The sum of the thicknesses of the first layer and the second layer constitutes the thickness of the fluorescent member.

In the light emitting device 100, the fluorescent member may contain the first layer such that the ratio of the thickness of the first layer relative to the thickness of the fluorescent member immediately above the light emitting element (thickness of the first layer/thickness of the fluorescent member) is, for example, 80% or more, preferably 90% or more, and more preferably 95% or more. In other words, the resin content of the fluorescent member 50 may be smaller than the fluorescent material 70 content of the fluorescent member 50.

The fluorescent member 50 can be formed, for example, by arranging a material containing the fluorescent material 70 and the resin on the recess of the molded body 40 to cover the light emitting element 10. Due to the difference in specific gravity usually existing between the fluorescent material 70 and the resin, allowing gravity to act toward the bottom surface of the molded body 40 causes the fluorescent material 70 to settle toward the bottom surface. This forms the sedimentary layer of the fluorescent material 70 in the fluorescent member 50. Also, the fluorescent material 70 may be settled by applying a force, such as a centrifugal force, toward the bottom surface. The resin to be contained in the fluorescent member 50 may be a thermosetting resin, which can be heat-cured after the settling of the fluorescent material 70 to create the fluorescent member 50 with unevenly dispersed fluorescent material 70.

Light-Emitting Element

The light emitting element 10 has a peak emission wavelength in a range of 400 nm to 500 nm, and preferably in a range of 400 nm to 460 nm.

The emission spectrum of the light emitting element 10 has a half bandwidth of, for example, 30 nm or less. As the light emitting element 10, for example, a semiconductor light emitting element including a nitride semiconductor ($In_X Al_Y Ga_{1-X-Y}N$, where X and Y satisfy $0 \leq X$, $0 \leq Y$, and $X+Y \leq 1$) is preferably used. Using a semiconductor light emitting element as the excitation light source produces a highly efficient light emitting device that has high output linearity to the input and is stable and resistant to mechanical impact.

Fluorescent Member

The fluorescent member 50 contains at least the fluorescent material 70, and may contain, for example, another fluorescent material, a resin, and a light diffusing agent as appropriate. The fluorescent material 70 contains at least one nitride fluorescent material that contains a silicon nitride having Al, Eu, and an alkali earth metal containing Ca and Sr in its composition, and has a peak wavelength of the fluorescence in a range of 630 nm to 670 nm. In the composition of the silicon nitride, Sr content of the silicon nitride is preferably greater than Ca content of the silicon nitride.

The fluorescent material 70 may have a composition essentially represented by formula (I) above.

In the formula (I), the ratio of s to w is, for example, 0.3 to 0.45, or 0.33 to 0.42; the ratio of t to w is, for example, 0.45 to 0.6 or 0.46 to 0.57; the ratio of u to w is, for example, 0.01 to 0.025 or 0.012 to 0.022; the ration of s+t+u to w is, for example, 0.85 to 1 or 0.87 to 0.95; and the ratio of v to w is, for example, 1 to 1.1 or 1.01 to 1.07.

The fluorescent material 70 may further contain in its composition, at least one element selected from the group consisting of Ba, Mg, Ge, B, Ce, Mn, and Tb, as another component, at a level that would not affect the emission properties, in particular, emission intensity and emission hue.

The fluorescent material 70 may contain atomic fluorine in its composition. Atomic Fluorine may be derived, for example, from the production process of the fluorescent material 70. When the fluorescent material 70 contains atomic fluorine, the fluorine atom content relative to, for example, aluminum is 6 mol % or less, preferably from $1 \times 10^{-3}$ mol % to 6 mol %, more preferably from $3 \times 10^{-3}$ mol % to 4 mol %, and still more preferably from $5 \times 10^{-3}$ mol % to 1.5 mol %. With the fluorine atom content within this range, the light emitting device may have improved emission efficiency.

The fluorescent material 70 may contain an oxygen component. The oxygen component may be contained, for example, in the composition of the fluorescent material 70, or contained as impurities, such as an oxide or an oxynitride of, for example, an alkaline earth metal, aluminum, or silicon. When the fluorescent material 70 contains an oxygen component, the oxygen atom content relative to, for example, aluminum is from 5 mol % to 50 mol %, preferably 6 mol % to 40 mol %, more preferably from 7 mol % to 30 mol %, still more preferably from 7 mol % to 15 mol %, and furthermore preferably from 7 mol % to 12 mol %. With the oxygen atom content within this range, the light emitting device may have improved emission efficiency.

The composition of the fluorescent material 70 may be determined using a conventional method through, for example, fluorescent X-ray analysis (XRF), ion chromatography (IC), or inductively coupled plasma atomic emission spectroscopy (ICP-AES).

The fluorescent material 70 has a peak emission wavelength of from 630 nm to 670 nm, preferably from 640 nm to 660 nm, or from 645 nm to 655 nm. The specific gravity of the fluorescent material 70 is, for example, 3.3 g/cm$^3$ or more, 3.6 g/cm$^3$ or more or 3.7 g/cm$^3$ or more, and for example, 4.3 g/cm$^3$ or less, 4.1 g/cm$^3$ or less, or 3.9 g/cm$^3$ or less. With the specific gravity of the fluorescent material being equal to or greater than the lower limit, the productivity in settling the fluorescent material in the fluorescent member improves, allowing the sedimentary layer of the fluorescent material to be formed more densely. Thus, scattering loss in the sedimentary layer of the fluorescent material can be reduced.

The reflectivity of the fluorescent material 70 is, for example, 10% or less, preferably 8% or less, and more preferably 7% or less at a wavelength of 450 nm. With the reflectivity equal to or lower than the upper limit, emission from the light emitting element can be efficiently absorbed, and the amount of the fluorescent material necessary for achieving the desired emission properties can be reduced. The lower limit of the reflectivity is, for example, 3% or more. The reflectivity of the fluorescent material 70 is measured from a solid sample using a spectrophotometer. As a reference for reflectivity, calcium hydrogen phosphate (CaHPO$_4$) is used. In other words, the reflectivity of the fluorescent material 70 is obtained as a reflectivity relative to calcium hydrogen phosphate used as a reference sample.

The volume average particle diameter of the fluorescent material 70 is, for example, from 5 μm to 50 μm, and can be 10 μm or more, or 15 μm or more, and 40 μm or less, 30 μm or less, or 25 μm or less. With the volume average particle diameter equal to or greater than the lower limit, the emission intensity from the fluorescent material may improve, whereas with the volume average particle diameter equal to or lower than the upper limit, the workability in the production of the light emitting device may improve. A volume average particle diameter is a value obtained by using a laser diffraction particle size analyzer (MASTER SIZER 3000 by Marvern Instrument Instrument), and is an average particle diameter (Dm: median diameter) at which the volume cumulative frequency from the small diameter side reaches 50%.

The fluorescent material 70 content in the fluorescent member, for example, relative to resin is from 40% by weight to 80% by weight, preferably from 40% by weight to 75% by weight, more preferably from 50% by weight to 75% by weight, and still more preferably from 55% by weight to 72% by weight. With the content equal to or greater than the lower limit, emission with higher color purity can be achieved. With the content equal to or lower than the upper limit, scattering loss of light in the fluorescent material is reduced, and higher luminous flux can be achieved.

The fluorescent material 70 is produced by a production method including heat treating a raw material mixture containing, for example, an Eu source, an alkali earth metal source containing Ca and Sr, an Al source, and an Si source. The raw material mixture preferably further contains an alkali earth metal fluoride. Using the raw material mixture containing an alkali earth metal fluoride produces a fluorescent material with higher emission efficiency.

Examples of the Eu source include a europium compound, a simple europium metal, and an alloy of europium. Examples of the europium compound include oxides, hydroxides, nitrides, oxynitrides, fluorides, and chlorides containing europium. Specific examples of the europium compound include europium oxide ($Eu_2O_3$), europium nitride (EuN), and europium fluoride ($EuF_3$). Using europium nitride (EuN), which is composed only of the elements of the target fluorescent material composition, can more effectively reduce impurities. Europium oxide ($Eu_2O_3$) and europium fluoride ($EuF_3$), which can serve as a flux, are preferably used. These europium compounds may be used individually, or two or more of them may be used in combination.

The Eu source may contain a rare-earth element, such as scandium (Sc), yttrium (Y), lanthanum (La), cerium (Ce), praseodymium (Pr), neodymium (Nd), samarium (Sm), gadolinium (Gd), terbium (Tb), dysprosium (Dy), holmium (Ho), erbium (Er), thulium (Tm), ytterbium (Yb), or lutetium (Lu).

Examples of the alkaline earth metal source include an alkaline earth metal compound, a simple alkaline earth metal, and an alloy of an alkaline earth metal. Examples of the alkaline earth metal compound include hydrides, oxides, hydroxides, nitrides, oxynitrides, chlorides, amide compounds, and imide compounds containing an alkaline earth metal, and, for example, hydrides and nitrides are preferable. The alkaline earth metal source may contain lithium (Li), sodium (Na), potassium (K), boron (B), or aluminum (Al).

Examples of the Al source include an aluminum compound, a simple aluminum metal, and an aluminum alloy. Examples of the aluminum compound include oxides, hydroxides, nitrides, oxynitrides, fluorides, and chlorides containing aluminum. Specific examples of the aluminum compound include aluminum nitride (AlN), aluminum oxide ($Al_2O_3$), and aluminum hydroxide ($Al(OH)_3$), and at least one selected from the group consisting of these compounds is preferable, and aluminum nitride is more preferable. Using aluminum nitride, which is composed only of the elements of the target fluorescent material composition, can more effectively reduce impurities. For example, in comparison with aluminum compounds containing oxygen or hydrogen, aluminum nitride can reduce the influence of these elements, and needs no nitriding reaction unlike simple metal. These aluminum compounds may be used individually, or two or more of them may be used in combination.

The Al source may contain a Group III element, such as gallium, indium, vanadium, chromium, and cobalt.

Examples of the Si source include a silicon compound, and a simple silicon substance. Examples of the silicon compound include oxides, hydroxides, nitrides, oxynitrides, fluorides, and chlorides containing silicon. Specific examples of the silicon compound include silicon oxide, silicon oxynitride, silicon nitride, and silicate, and at least one selected from the group consisting of these compounds is preferable, and silicon nitride is more preferable. Using silicon nitride, which is composed only of the elements of the target fluorescent material composition, can more effectively reduce impurities. For example, in comparison with a silicon compound containing oxygen or hydrogen, silicon nitride can reduce the influence of these elements, and needs no nitriding reaction unlike simple metal. The silicon compounds may be used individually, or two or more of them may be used in combination.

The Si source may contain a Group IV element, such as germanium, tin, titanium, zirconium, and hafnium.

The raw material mixture may contain at least one alkaline earth metal fluoride. The alkaline earth metal contained in the alkaline earth metal fluoride is at least one selected from the group consisting of magnesium (Mg), calcium (Ca), strontium (Sr), and barium (Ba), preferably contains at least Sr and at least one selected from the group consisting of Mg, Ca, and Ba, and more preferably contains at least one of Sr and Ca. When the raw material mixture contains an alkali earth metal fluoride, the alkaline earth metal fluoride content of the raw material mixture is such that the content ratio of fluorine atom to Al is from 2 mol % to 25 mol %, preferably from 3 mol % to 18 mol %, and more preferably from 4 mol % to 13 mol %. With the molar content ratio equal to or greater than the lower limit, the effect as flux can fully be achieved. Some amount of flux is enough to achieve its maximum effect, and no more effect can be expected by further increasing the amount of flux. Thus, with the molar content ratio equal to or lower than the upper limit, the effect as flux can be obtained without containing excessive flux.

The raw material mixture may further contain, for example, other halides as flux in addition to the alkali metal earth fluoride. Examples of other halides include chlorides and fluorides of rare-earths and alkali metal. When the raw material mixture contains additional flux, the flux content relative to the alkali metal earth fluoride in the raw material is, for example, 20% by mass or less, preferably 10% by mass or less, and more preferably 1% by mass or less.

The raw material mixture may be obtained by weighing the components to be included in the material mixture to have a desired compounding ratio, and then mixing the components with a ball mill, or with a mixing machine, such as a Henschel mixer or a V-blender, or with a mortar and a pestle. The mixing may be dry mixing, or wet mixing by adding, for example, a solvent.

Heat treating the resulting raw material mixture produces the fluorescent material 70 having high emission intensity. The heat-treating temperature of the raw material mixture is, for example, 1200° C. or more, preferably 1500° C. or more, and more preferably 1900° C. or more. The heat-treating temperature is also, for example, 2200° C. or less, preferably 2100° C. or less, and more preferably 2050° C. or less. Heat treating at a temperature equal to or greater than the lower limit allows Eu to easily enter the crystal to efficiently form the intended fluorescent material 70. Heat treating at a temperature equal to or lower than the upper limit may reduce degradation of the resulting fluorescent material 70. The raw material mixture may be heat treated at a single temperature, or may be heat treated step-wise at two or more temperatures.

The atmosphere for heat treating the raw material mixture is preferably a nitrogen gas-containing atmosphere, and more preferably, essentially a nitrogen gas atmosphere. A nitrogen gas-containing atmosphere also allows nitriding of silicon contained in the raw material. Further, such an atmosphere can also suppress degradation of the raw material, which is a nitride, and the resulting fluorescent material 70.

The pressure for heat treating the raw material mixture is preferably high to suppress degradation of the resulting fluorescent material 70, and may be, for example, from normal pressure to 200 MPa. The pressure is preferably from 0.1 MPa to 200 MPa, and more preferably from 0.6 MPa to 1.2 MPa, which poses fewer restrictions on industrial equipment.

Heat treating of the raw material mixture may have a retention time at a predetermined temperature. The retention time is, for example, from 0.5 hour to 48 hours, preferably from 1 hour to 30 hours, and more preferably from 2 hours to 20 hours. A retention time equal to or greater than the lower limit may further accelerate uniform particle growth. A retention time equal to or lower than the upper limit may further suppress degradation of the resulting fluorescent material 70.

The raw material mixture may be heat treated by using, for example, a gas pressurized electric furnace. The raw material mixture may be heat treated, for example, by filling the raw material mixture into, for example, a crucible or a boat formed from a carbon material, such as graphite, or a boron nitride (BN) material.

After heat treating the raw material mixture, a sizing step including crushing, grinding, and classifying of the resulting fluorescent material may be performed. Particles with a desired particle diameter can be obtained by the sizing step. Specifically, after roughly grinding the fluorescent material, the resulting product may be ground using a typical grinder, such as a ball mill, a jet mill, or a vibration mill to have a predetermined particle diameter. Excessive grinding, however, may cause defects on the surfaces of the silicon nitride particles, resulting in a luminance drop. When particles having different particle diameters are present after grinding, the particles may be classified to have a uniform particle diameter.

The fluorescent member may contain other fluorescent materials as appropriate in addition to the fluorescent material represented by formula (I). Examples of other fluorescent materials include $(Sr,Ca)LiAl_3N_4$:Eu, $(Ca,Sr,Ba)_2Si_5N_8$:Eu, $(Ca,Sr,Ba)S$:Eu, $K_2(Si,Ti,Ge)F_6$:Mn, and $3.5MgO\cdot0.5MgF_2\cdot GeO_2$:Mn.

The fluorescent member 50 may contain at least one resin in addition to the fluorescent material 70. The resin may be, for example, epoxy resin, or silicone resin.

The fluorescent member 50 may contain other components as appropriate in addition to the fluorescent material 70. Examples of other components include a filler, such as silica, barium titanate, titanium oxide, or aluminum oxide, a light stabilizer, and a colorant. When the fluorescent member 50 contains, for example, a filler as the other components, the filler content relative to resin may be from 0.01 to 20 parts by weight.

EXAMPLES

The present invention will now be described in detail with reference to examples, but the present invention is not limited to these examples.

Fluorescent Material

Before the production of the light emitting device, red light emitting Fluorescent Materials 1 to 5 as shown in Table 1 below were each prepared, and evaluated in accordance with the evaluation method described below.

Emission Properties

For each of Fluorescent Materials 1 to 5 obtained by the later described method, the emission properties as described below were determined. Using a quantum efficiency measurement system (QE-2000, by Otsuka Electronics), excitation light with a wavelength of 450 nm was applied to each fluorescent material to measure the emission spectrum at room temperature (25° C.±5° C.). For each fluorescent material, a wavelength at which the emission intensity reaches its maximum was obtained as a peak emission wavelength (nm). Table 1 shows the results.

Reflectivity

Figure 2:
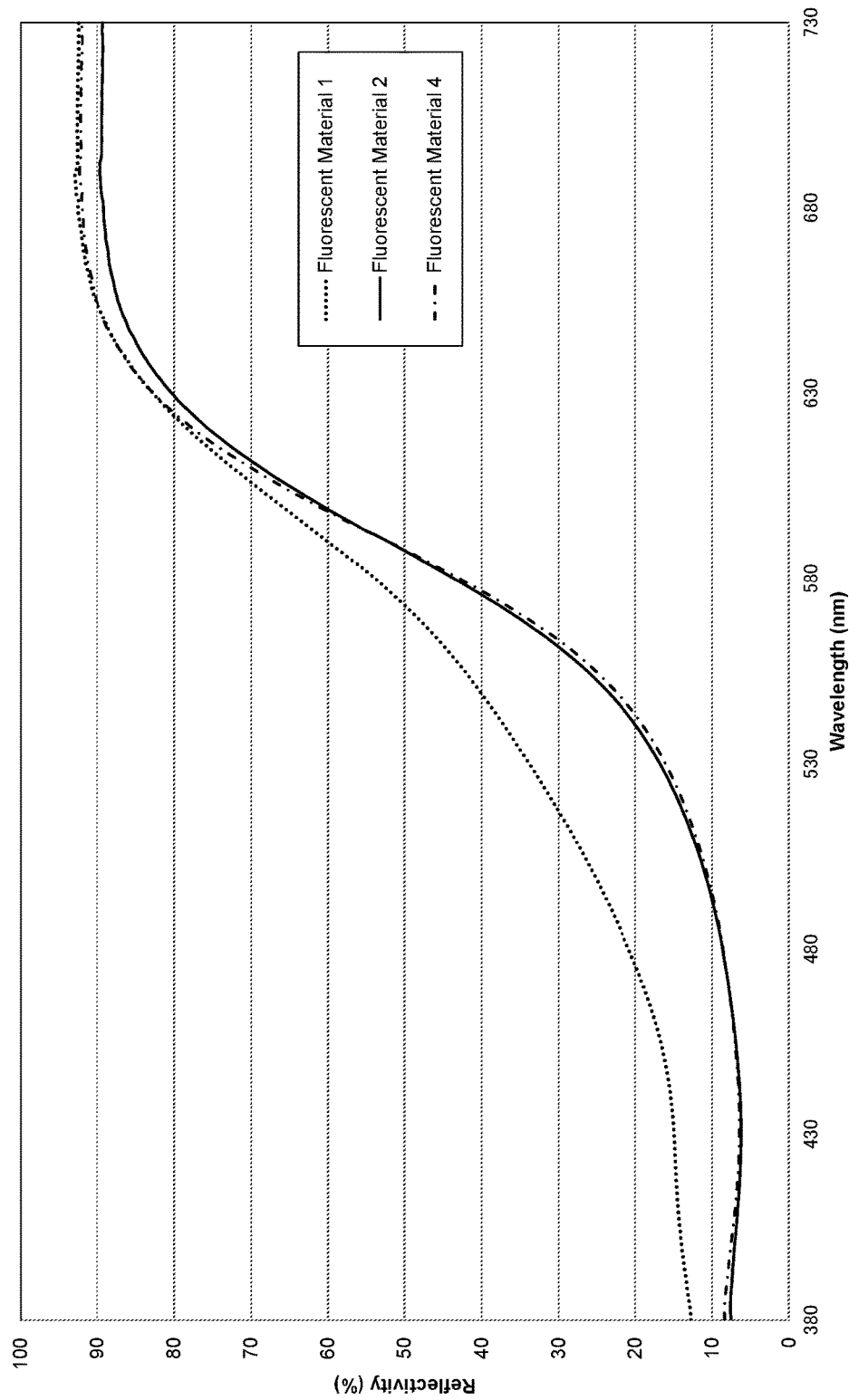
FIG. 2 shows exemplary reflection spectra of fluorescent materials according to embodiments of the present disclosure.

For each of Fluorescent Materials 1 to 5 obtained by the later described method, the reflectivity and reflection spectrum were measured using Spectrofluorometer F-4500 (by Hitachi High Technologies Corporation). Table 1 shows each reflectivity (%) relative to the reflectivity of $CaHPO_4$ at a wavelength of 450 nm as a reference. FIG. 2 shows the reflection spectra of Fluorescent Materials 1, 2 and 4 as reflectivity (%) versus wavelength relative to the reflectivity of $CaHPO_4$ used as a reference.

Volume Average Particle Diameter

For each of Fluorescent Materials 1 to 5 obtained by the later described method, the average particle diameter (Dm: median diameter) at which the volume cumulative frequency from the small diameter side reaches 50% was measured using a laser diffraction particle size analyzer (Master Sizer 3000 by Marvern Instrument). Table 1 shows the results.

Composition Analysis

For each of Fluorescent Materials 1 to 5 obtained by the later described method, the composition was analyzed using an ICP-AES system (by Perkin Elmer), an ion chromatography system (by Dionex Japan), and an oxygen/nitrogen analyzer (by Horiba). Table 2 shows the molar ratio of each element when Al is 0.9 or 1.

For Fluorescent Materials 1 to 3, no atomic fluorine was detected, whereas for Fluorescent Materials 4 and 5, fluorine atom content relative to aluminum of 6 mol % or less was detected.

Fluorescent Material 1

$Ca_3N_2$, $SrN_n$ (n=2/3 equivalent), AlN, $Si_3N_4$ and $Eu_2O_3$ to be used as raw materials were weighed and mixed in a glovebox in an inert atmosphere to satisfy design values: s=0.9925, t=0, u=0.0075, v=1.1, and w=0.9 in the composition represented by the formula (I): $Ca_sSr_tEu_uSi_vAl_wN_x$, to obtain a raw material mixture. In the composition, x=3 based on the design values of all the cations, and the influence of oxygen contained in the raw materials was ignored. The raw material mixture was charged into a crucible, and heat treated at 1950° C. for 3 hours in $N_2$ gas atmosphere under a gas pressure of 0.92 MPa (gauge pressure) to obtain Fluorescent Material 1.

The thus obtained Fluorescent Material 1 was confirmed to be a compound containing the elements in accordance with the molar ratio shown in Table 2. The volume average particle diameter of Fluorescent Material 1 was 17.0 μm, the peak emission wavelength was 652 nm, and the reflectivity at 450 nm was 16.1%.

Fluorescent Material 2

In the composition represented by formula (I) $Ca_sSr_tEu_uSi_vAl_wN_x$, design values were set as follows: s=0.4, t=0.6, u=0.015, v=1, and w=1. In other words, the molar ratios of Eu and Sr were increased to allow the peak emission wavelength of the present fluorescent material to be close to the peak emission wavelength of Fluorescent Material 1.

Except for this, a raw material mixture was obtained in the same manner as in Fluorescent Material 1. The raw material mixture was heat treated in the same manner as in Fluorescent Material 1 except that the temperature was changed to 2000° C. and duration of heating was changed to 1 hour to obtain Fluorescent Material 2.

The thus obtained Fluorescent Material 2 was confirmed to be a compound containing the elements in accordance with the molar ratio shown in Table 2. The volume average particle diameter of Fluorescent Material 2 was 18.6 μm, the peak emission wavelength was 649 nm, and the reflectivity at 450 nm was 6.8%. When the emission intensity of Fluorescent Material 1 was taken as 100%, the relative emission intensity of Fluorescent Material 2 was 95.6%.

Fluorescent Material 3

In the composition represented by formula (I), $Ca_sSr_tEu_uSi_vAl_wN_x$, design values were set as follows: s=0.35, t=0.65, u=0.02, v=1, and w=1. In other words, the molar ratios of Eu and Sr were set to be greater than those of Fluorescent Material 2 to allow the peak emission wavelength of the present fluorescent material to be closer to the peak emission wavelength of Fluorescent Material 1. Except for this, a raw material mixture was obtained in the same manner as in Fluorescent Material 1. The raw material mixture was heat treated in the same manner as in Fluorescent Material 2 to obtain Fluorescent Material 3.

The volume average particle diameter of Fluorescent Material 3 was 18.2 m, the peak emission wavelength was 651 nm, and the reflectivity at 450 nm was 5.7%. When the emission intensity of Fluorescent Material 1 was taken as 100%, the relative emission intensity of Fluorescent Material 3 was 93.0%.

Fluorescent Material 4

The composition of the raw material mixture was set to be the same as in Fluorescent Material 2, and the raw material mixture was obtained in the same manner as in Fluorescent Material 2 except that 7% by weight of $Ca_3N_2$ as a Ca source was replaced with $CaF_2$, and $Eu_2O_3$ as an Eu source was replaced with EuN. The raw material mixture was heat treated in the same manner as in Fluorescent Material 2 to obtain Fluorescent Material 4.

The volume average particle diameter of Fluorescent Material 4 was 17.1 μm, the peak emission wavelength was 649 nm, and the reflectivity at 450 nm was 6.8%. When the emission intensity of Fluorescent Material 1 was taken as 100%, the relative emission intensity of Fluorescent Material 4 was 104.2%.

Fluorescent Material 5

The composition of the raw material mixture was set to be the same as in Fluorescent Material 3, and the raw material mixture was obtained in the same manner as in Fluorescent Material 3 except that 8% by weight of $Ca_3N_2$ as a Ca source was replaced with $CaF_2$, and $Eu_2O_3$ as an Eu source was replaced with EuN. The raw material mixture was heat treated in the same manner as in Fluorescent Material 2 to obtain Fluorescent Material 5.

The volume average particle diameter of Fluorescent Material 5 was 17.3 μm, the peak emission wavelength was 651 nm, and the reflectivity at 450 nm was 6.1%. When the emission intensity of Fluorescent Material 1 was taken as 100%, the relative emission intensity of Fluorescent Material 5 was 102.7%.

TABLE 1

| | Volume average particle diameter $D_m$ (μm) | Relative emission intensity $I_p$ (%) | Peak emission wavelength $\lambda_p$ (nm) | Reflectivity (%) at 450 nm | Specific gravity (g/cm³) |
|---|---|---|---|---|---|
| Fluorescent Material 1 | 17.0 | 100 | 652 | 16.1 | 3.24 |
| Fluorescent Material 2 | 18.6 | 95.6 | 649 | 6.8 | 3.74 |
| Fluorescent Material 3 | 18.2 | 93.0 | 651 | 5.7 | 3.80 |
| Fluorescent Material 4 | 17.1 | 104.2 | 649 | 6.8 | 3.75 |
| Fluorescent Material 5 | 17.3 | 102.7 | 651 | 6.1 | 3.85 |

Fluorescent Materials 2 to 5 each show approximately the same volume average particle diameter and emission wavelength as those of Fluorescent Material 1. However, Fluorescent Materials 2 to 5 show significantly lower reflectivities than Fluorescent Material 1 at a wavelength of 450 nm. Thus, the light absorption at a wavelength of around 450 nm of Fluorescent Materials 2 to 5 is believed to be high. The reflection spectra in FIG. 2 show that the reflectivities at short wavelengths of Fluorescent Material 2 and 4 are lower than the reflectivity of Fluorescent Material 1. Also, Fluorescent Materials 2 to 5 have higher specific gravity than Fluorescent Material 1.

TABLE 2

| | Ca | Sr | Eu | Si | Al | N | O | Sr + Ca + Eu |
|---|---|---|---|---|---|---|---|---|
| Fluorescent Material 1 | 0.900 | 0 | 0.005 | 1.098 | 0.9 | 2.88 | 0.06 | 0.91 |
| Fluorescent Material 2 | 0.404 | 0.475 | 0.014 | 1.052 | 1 | 2.89 | 0.09 | 0.89 |
| Fluorescent Material 3 | 0.353 | 0.515 | 0.018 | 1.022 | 1 | 2.85 | 0.10 | 0.89 |
| Fluorescent Material 4 | 0.403 | 0.511 | 0.015 | 1.047 | 1 | 2.90 | 0.07 | 0.93 |
| Fluorescent Material 5 | 0.355 | 0.556 | 0.020 | 1.047 | 1 | 2.98 | 0.07 | 0.93 |

The composition analysis indicates that fluorescent materials having a composition approximately corresponding to the design values were obtained, and that Fluorescent Materials 2 to 5 satisfy the formula (I).

Comparative Example 1, Examples 1 to 4

Production of Light Emitting Device

Light emitting devices were each produced in a manner described below by combining a blue color emitting LED (light emitting element) having an emission wavelength of 454 nm with a fluorescent material shown in Table 3.

Each light emitting device was produced in the steps described below: A fluorescent material was added to silicone resin such that light to be emitted by the light emitting device has chromaticity coordinates around x=0.675 and y=0.315, mixed, dispersed, and then defoamed to have a fluorescent material-containing resin composition. The fluorescent material-containing resin composition was poured onto the light emitting element, and filled the recess of the device. The resin composition was then cured by heating.

Figure 3:
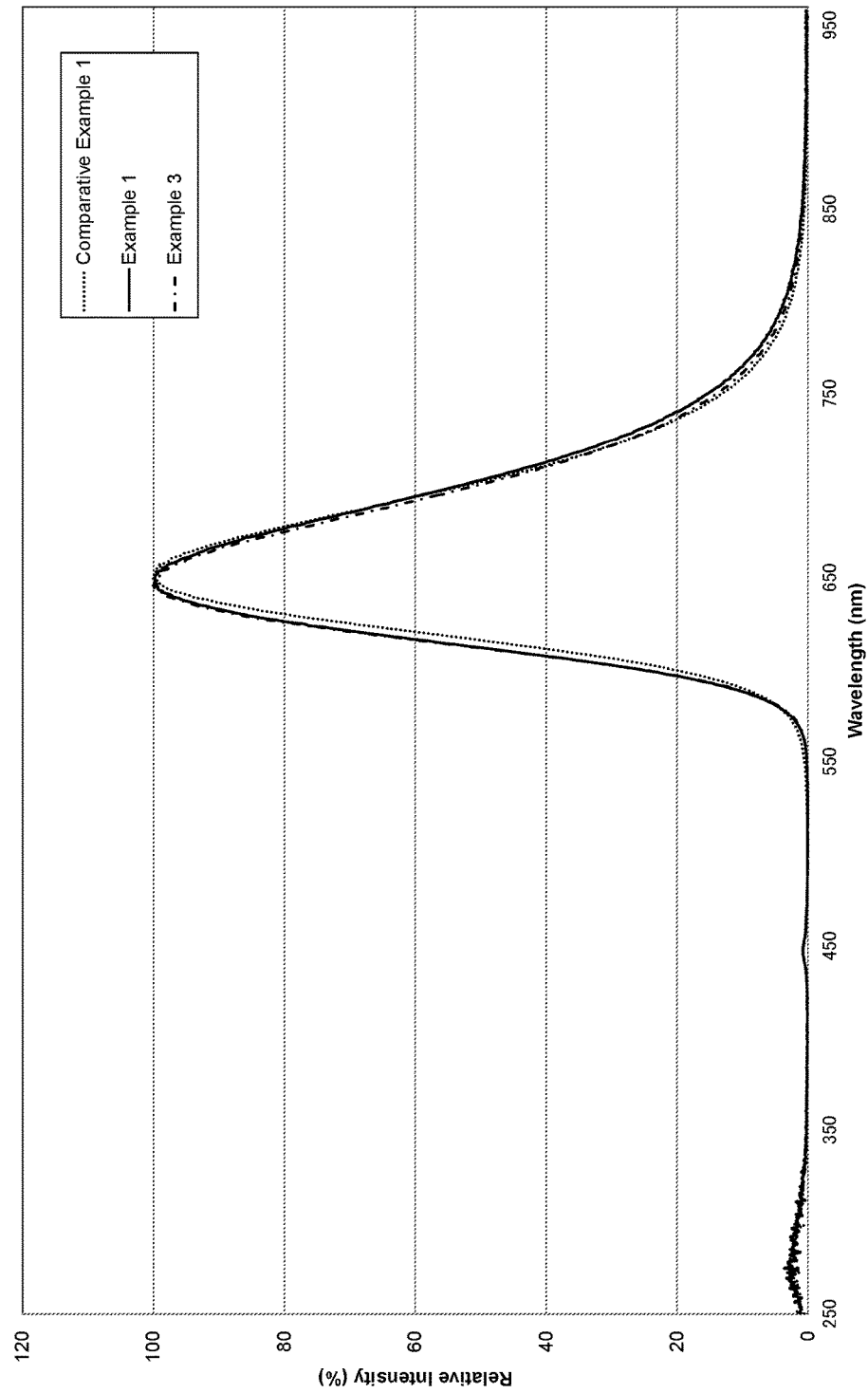
FIG. 3 shows exemplary emission spectra of light emitting devices according to embodiments of the present disclosure and a comparative light emitting device.
Figure 4:
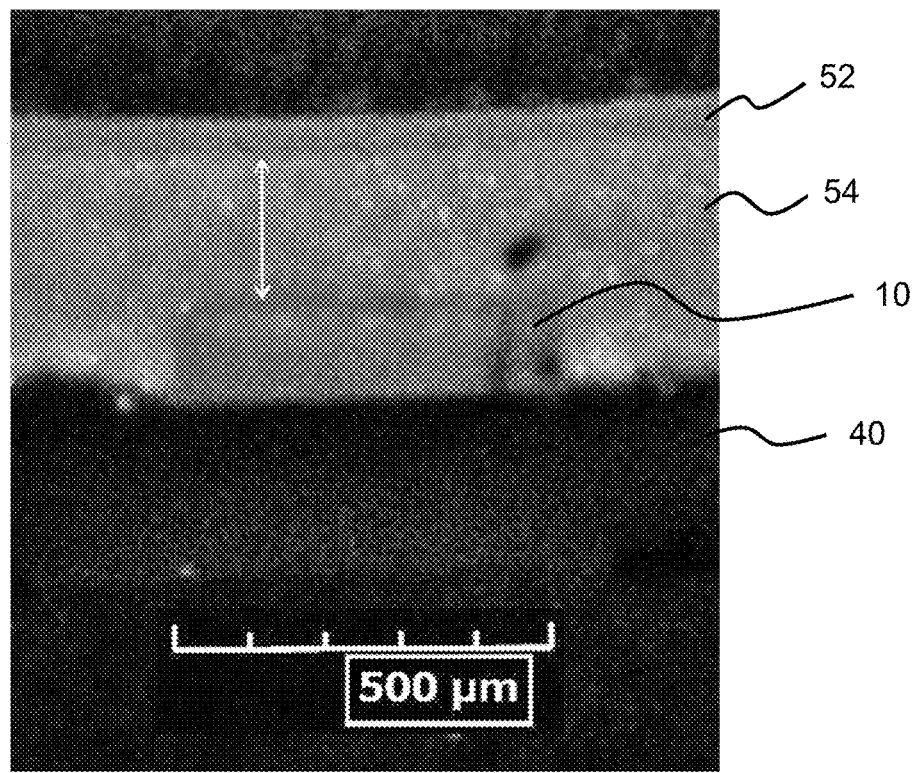
FIG. 4 is a partially enlarged cross-sectional image of a comparative light emitting device.
Figure 5:
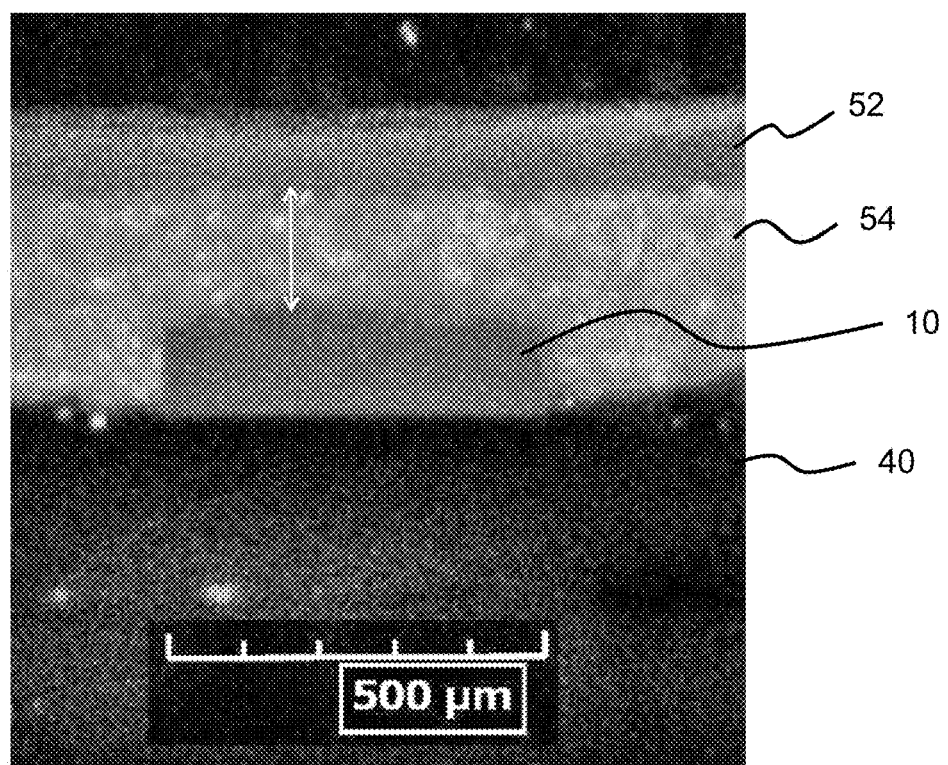
FIG. 5 is a partially enlarged cross-sectional image of a light emitting device according to an embodiment of the present disclosure.
Figure 6:
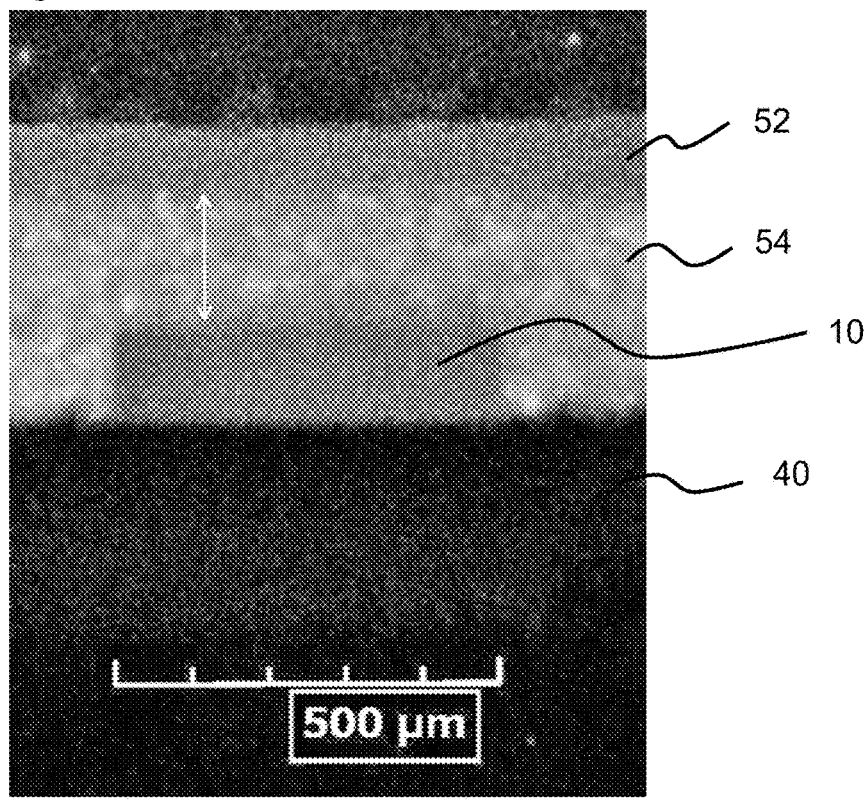
FIG. 6 is a partially enlarged cross-sectional image of a light emitting device according to an embodiment of the present disclosure.
Figure 7:
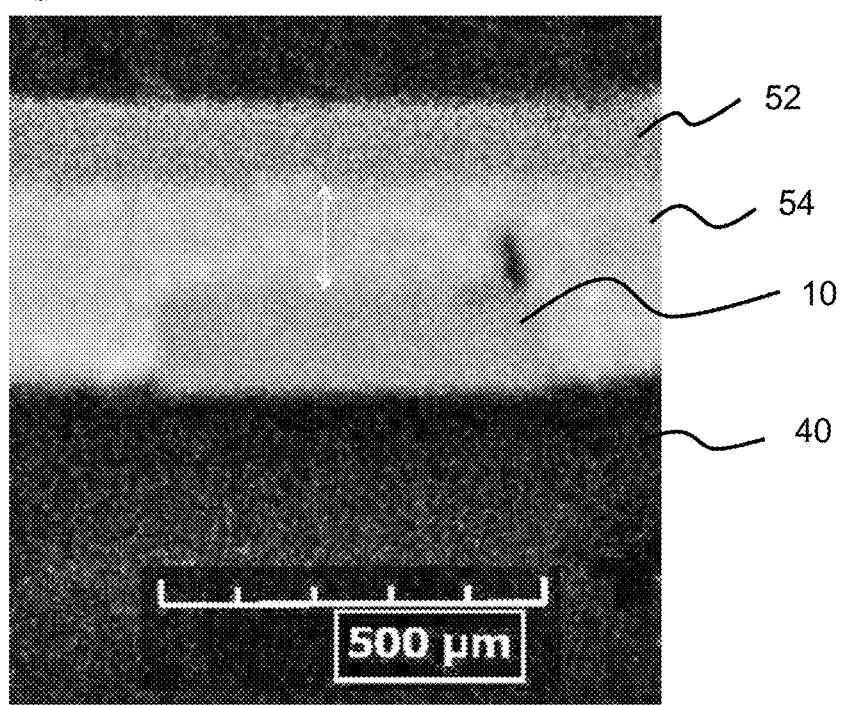
FIG. 7 is a partially enlarged cross-sectional image of a light emitting device according to an embodiment of the present disclosure.
Figure 8:
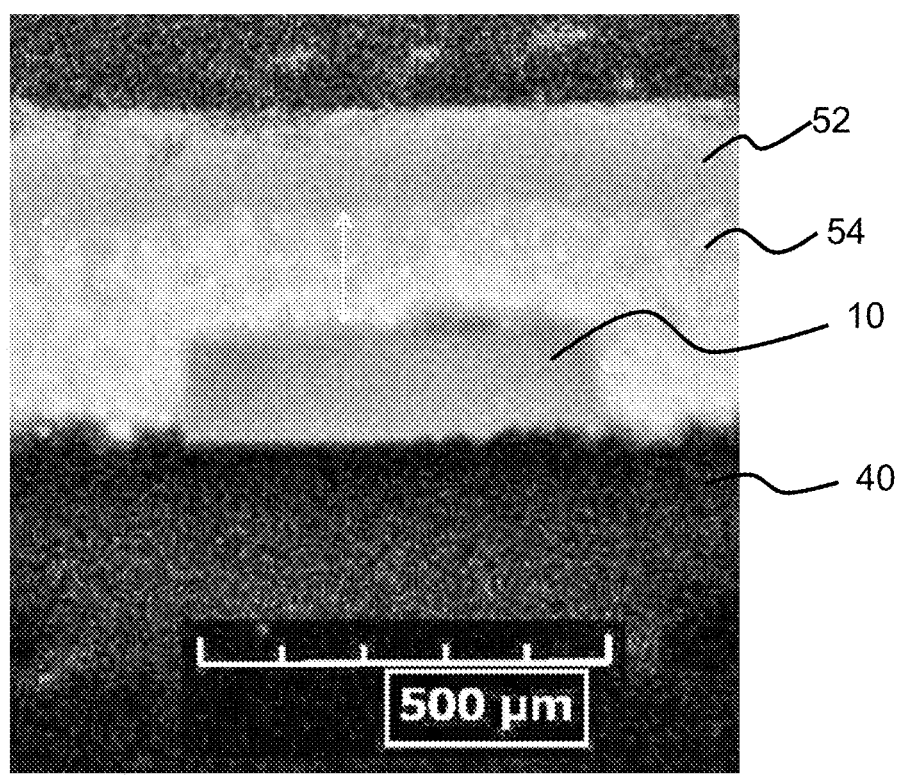
FIG. 8 is a partially enlarged cross-sectional image of a light emitting device according to an embodiment of the present disclosure.

FIG. 3 shows emission spectra of the light emitting devices of Comparative Example 1 and Examples 1 and 3. FIG. 3 shows emission intensity of each light emitting device relative to its maximum emission intensity (100%). FIGS. 4 to 8 respectively show an enlarged cross-sectional image orthogonal to the bottom surface of the molded body 40 of the light emitting devices of Comparative Example 1 and Examples 1 to 4. FIGS. 4 to 8 each show a light emitting element 10 arranged on the bottom surface of the molded body 40, a sedimentary layer 54 of the fluorescent material covering the light emitting element 10, and a resin layer 52 arranged on the sedimentary layer 54. The thickness of the sedimentary layer 54 of the fluorescent material immediately above the light emitting element 10 is indicated with a bidirectional arrow.

For each light emitting device, Table 3 shows the weight ratio (%) of the fluorescent material relative to the resin in the fluorescent member, the chromaticity coordinates, the luminous flux ratio (%) relative to the luminous flux of the light emitting device of Comparative Example 1 used as a reference (100.0%), the intensity ratio (%) of the emission intensity at 454 nm (peak emission wavelength of the light emitting element) when the maximum emission intensity of the emission spectrum is taken as 100%, and the half bandwidth of the main peak emission of the light emitting device. Comparative Example 1 is a light emitting device including Fluorescent Material 1 with a minimum weight for achieving the chromaticity coordinates as shown in Table 3. The luminous flux of each of the light emitting devices of Comparative Example 1 and Examples 1 to 4 was measured using a total luminous flux measuring system with an integrating sphere. The thicknesses of the sedimentary layer 54 and the resin layer 52 of each fluorescent material of FIGS. 4 to 8 immediately above the light emitting element were measured, and the percentage of the thickness of the sedimentary layer 54 relative to the sum of the thicknesses of the resin layer 52 and the sedimentary layer 54 (thickness of the fluorescent member) was calculated. Table 4 shows the results. The thickness of the sedimentary layer 54 was measured as a distance between the intersection of a straight line orthogonal to the bottom surface of the molded body 40 with the top surface of the light emitting element 10 to the intersection with the interface between the sedimentary layer 54 of the fluorescent material 70 and the resin layer 52 in the fluorescent member 50. The thickness of the resin layer 52 was measured as a distance from the intersection of the straight line with the interface between the sedimentary layer 54 and the resin layer 52 to the intersection with the surface of the fluorescent member. The measurement of the thickness was made on a randomly selected straight line orthogonal to the bottom surface of the molded body 40.

TABLE 4

|  | Sedimentary layer thickness (µm) | Fluorescent member thickness (µm) | Thickness ratio (%) |
| --- | --- | --- | --- |
| Comparative Example 1 | 196 | 225 | 87 |
| Example 1 | 168 | 260 | 65 |
| Example 2 | 159 | 242 | 66 |
| Example 3 | 131 | 242 | 54 |
| Example 4 | 131 | 242 | 54 |

As shown in Table 3, in the light emitting devices of Examples 1 to 4, the weight ratio of the fluorescent material is from 60% by weight to 70% by weight, which is smaller than 110% by weight of Comparative Example 1. Thus, with a smaller weight of the fluorescent material compared with the light emitting device of Comparative Example 1, light with about the same chromaticity coordinates is emitted. This is presumably attributable, for example, to the fact that blue light is more absorbed by Fluorescent Materials 2 to 5. This is related, for example, to the fact that as shown in Table 1, reflectivities at 450 nm are lower in Fluorescent Materials 2 to 5 than in Fluorescent Material 1. In any of these light emitting devices, the x value of CIE 1931 chromaticity coordinates is 0.640 or more, emitting red-light with practical color purity. Also, the emission color of these light emitting devices lies within the chromaticity range defined by an area determined by connecting points (0.500, 0.280), (0.540, 0.340), (0.625, 0.375), (0.735, 0.262), and (0.600, 0.200) with straight lines.

When the maximum emission intensity in the emission spectrum is taken as 100%, the emission intensity of the light emitting element at a peak emission wavelength of 454 nm shows an intensity ratio of from 0.2% to 2.0%, and the ratio of blue color emission derived from the light emitting element is small. With the emission intensity ratio of 0.2% or more, the amount of the fluorescent material is suitably reduced, and emission efficiency improves because scattering loss of light is reduced. In the present embodiment, the weight ratio of the fluorescent material is controlled to be within a predetermined range, and the emission intensity derived from the light emitting element is controlled to be within a predetermined range. This produces a red light emitting device with high emission efficiency. The half bandwidth of the main peak emission of the light emitting devices of Examples 1 to 4 is from 88 nm to 91 nm, which

TABLE 3

|  | Fluorescent Material Type | Weight ratio (%) | Chromaticity coordinates x | Chromaticity coordinates y | Luminous flux ratio (%) | Relative Emission intensity (%) at 454 nm | Half bandwidth (nm) |
| --- | --- | --- | --- | --- | --- | --- | --- |
| Comparative Example 1 | Fluorescent Material 1 | 110.0 | 0.676 | 0.314 | 100.0 | 0.69 | 86 |
| Example 1 | Fluorescent Material 2 | 70.0 | 0.678 | 0.315 | 104.2 | 0.72 | 91 |
| Example 2 | Fluorescent Material 3 | 60.0 | 0.679 | 0.313 | 102.1 | 0.71 | 91 |
| Example 3 | Fluorescent Material 4 | 65.0 | 0.678 | 0.314 | 110.4 | 0.68 | 88 |
| Example 4 | Fluorescent Material 5 | 60.0 | 0.678 | 0.313 | 112.1 | 0.81 | 89 | is greater than a typical half bandwidth of emission spectrum of a red-light emitting LED, and is approximately the same as the half bandwidth of the emission spectrum of any of Fluorescent Materials 1 to 5.

Unlike Examples 1 and 2, a fluorescent material containing $CaF_2$ was used in the production of the fluorescent material in Examples 3 and 4. In Examples 3 and 4, the luminous flux ratio is further improved by 6% to 10% compared to Examples 1 and 2. Addition of $CaF_2$ in the production of a fluorescent material is believed to have contributed, for example, to the improvement of crystalline state of the resulting fluorescent material in Examples 3 and 4, which resulted in greater luminous flux ratio.

As shown in Table 4, the light emitting devices of Examples 1 to 4 each have a sedimentary layer with a smaller thickness immediately above the fluorescent material of the light emitting element compared with the light emitting device of Comparative Example 1. This is believed to be related to the fact that the light emitting devices of Examples 1 to 4 each have higher luminous flux than the light emitting device of Comparative Example 1. This can be analyzed as follows: Fluorescent Materials 2 to 5 used in Examples 1 to 4 each have a greater specific gravity than Fluorescent Material 1 of Comparative Example 1. Thus, the fluorescent material particles tend to settle in the formation process of the fluorescent member containing Fluorescent Materials 2 to 5. This produces denser sedimentary layer of the fluorescent material, so that the sedimentary layer can have a relatively smaller thickness. With the sedimentary layer of the fluorescent material with a smaller thickness, scattering loss of light in the fluorescent member is reduced, resulting in a higher luminous flux of the light emitting device.

The light emitting device according to the present disclosure is a red light emitting device including a blue color emitting diode as a light source and having high emission properties. The light emitting device according to the present disclosure can advantageously be used, for example, for vehicle's stop lamps, illumination light sources, displays, backlight light sources, and warning lights.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

Although the present disclosure has been described with reference to several exemplary embodiments, it is to be understood that the words that have been used are words of description and illustration, rather than words of limitation. Changes may be made within the purview of the appended claims, as presently stated and as amended, without departing from the scope and spirit of the disclosure in its aspects. Although the disclosure has been described with reference to particular examples, means, and embodiments, the disclosure may be not intended to be limited to the particulars disclosed; rather the disclosure extends to all functionally equivalent structures, methods, and uses such as are within the scope of the appended claims.

One or more examples or embodiments of the disclosure may be referred to herein, individually and/or collectively, by the term "disclosure" merely for convenience and without intending to voluntarily limit the scope of this application to any particular disclosure or inventive concept. Moreover, although specific examples and embodiments have been illustrated and described herein, it should be appreciated that any subsequent arrangement designed to achieve the same or similar purpose may be substituted for the specific examples or embodiments shown. This disclosure may be intended to cover any and all subsequent adaptations or variations of various examples and embodiments. Combinations of the above examples and embodiments, and other examples and embodiments not specifically described herein, will be apparent to those of skill in the art upon reviewing the description.

In addition, in the foregoing Detailed Description, various features may be grouped together or described in a single embodiment for the purpose of streamlining the disclosure. This disclosure may be not to be interpreted as reflecting an intention that the claimed embodiments require more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately claimed subject matter.

The above disclosed subject matter shall be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure may be determined by the broadest permissible interpretation of the following claims and their equivalents, and shall not be restricted or limited by the foregoing detailed description.

All publications, patent applications, and technical standards mentioned in this specification are herein incorporated by reference to the same extent as if each individual publication, patent application, or technical standard was specifically and individually indicated to be incorporated by reference.

What is claimed is:

1. A light emitting device comprising:
   a light emitting element having a peak emission wavelength in a range of 400 nm to 500 nm, and
   a fluorescent member containing a fluorescent material having a peak emission wavelength in a range of 630 nm to 670 nm and a composition represented by formula (I):

$$Ca_sSr_tEu_uSi_vAl_wN_x \qquad (I)$$

wherein s, t, u, v, w, and x satisfy $0.25 \leq s \leq 0.5$, $0.4 \leq t \leq 0.75$, $0.01 \leq u \leq 0.04$, $0.8 \leq s+t+u \leq 1.1$, $0.8 \leq v \leq 1.2$, $0.8 \leq w \leq 1.2$, $1.8 \leq v+w \leq 2.2$, and $2.5 \leq x \leq 3.2$ and,
   emitting light having an x value of CIE 1931 chromaticity coordinates of 0.640 or more.

2. A light emitting device comprising:
   a light emitting element having a peak emission wavelength in a range of 400 nm to 500 nm, and
   a fluorescent member containing a fluorescent material having a peak emission wavelength in a range of from 630 nm to 670 nm, and a composition represented by formula (I):

$$Ca_sSr_tEu_uSi_vAl_wN_x \qquad (I)$$

wherein s, t, u, v, w, and x satisfy $0.25 \leq s \leq 0.5$, $0.4 \leq t \leq 0.75$, $0.01 \leq u \leq 0.04$, $0.8 \leq s+t+u \leq 1.1$, $0.8 \leq v \leq 1.2$, $0.8 \leq w \leq 1.2$, $1.8 \leq v+w \leq 2.2$, and $2.5 \leq x \leq 3.2$ and,
   emitting light with chromaticity coordinates (x, y) within a chromaticity range defined by an area determined by connecting points (0.500, 0.280), (0.540, 0.340), (0.625, 0.375), (0.735, 0.262), and (0.600, 0.200) with straight lines in a CIE 1931 chromaticity diagram.

3. The light emitting device according to claim 1, wherein the fluorescent member contains a resin, and a percentage of the fluorescent material relative to the resin is from 40% by weight to 80% by weight.

4. The light emitting device according to claim 1, wherein the light emitting element has an emission intensity at a peak emission wavelength of from 0.2% to 2% relative to a maximum emission intensity in an emission spectrum of the light emitting device.

5. The light emitting device according to claim 1, wherein a ratio of t to w is from 0.45 to 0.6.

6. The light emitting device according to claim 1, wherein the fluorescent material has a reflectivity of 10% or less relative to light at a wavelength of 450 nm.

7. The light emitting device according to claim 1, wherein the fluorescent material has a volume average particle diameter of from 5 μm to 50 μm.

8. The light emitting device according to claim 1, wherein the fluorescent member contains a resin, and a layer containing the fluorescent material immediately above the light emitting element has a thickness of 180 μm or less.

9. The light emitting device according to claim 2, wherein the fluorescent member contains a resin, and a percentage of the fluorescent material relative to the resin is from 40% by weight to 80% by weight.

10. The light emitting device according to claim 2, wherein the light emitting element has an emission intensity at a peak emission wavelength of from 0.2% to 2% relative to a maximum emission intensity in an emission spectrum of the light emitting device.

11. The light emitting device according to claim 2, wherein a ratio of t to w is from 0.45 to 0.6.

12. The light emitting device according to claim 2, wherein the fluorescent material has a reflectivity of 10% or less relative to light at a wavelength of 450 nm.

13. The light emitting device according to claim 2, wherein the fluorescent material has a volume average particle diameter of from 5 μm to 50 μm.

14. The light emitting device according to claim 2, wherein the fluorescent member contains a resin, and a layer containing the fluorescent material immediately above the light emitting element has a thickness of 180 μm or less.

15. The light emitting device according to claim 1, wherein a ratio of s to w is 0.3 to 0.45.

16. The light emitting device according to claim 2, wherein a ratio of s to w is 0.3 to 0.45.

* * * * *